(12) United States Patent
Meyer et al.

(10) Patent No.: US 9,133,390 B2
(45) Date of Patent: *Sep. 15, 2015

(54) LIGHT EMITTING DIODE DEVICE WITH LUMINESCENT MATERIAL

(75) Inventors: Joerg Meyer, Aachen (DE); Volker Weiler, Aachen (DE); Josef Peter Schmidt, Aachen (DE)

(73) Assignee: Koninklijke Philips N.V., Eindhoven (NL)

( * ) Notice: Subject to any disclaimer, the term of this patent is extended or adjusted under 35 U.S.C. 154(b) by 171 days.

This patent is subject to a terminal disclaimer.

(21) Appl. No.: 13/511,159

(22) PCT Filed: Dec. 10, 2010

(86) PCT No.: PCT/IB2010/055733
§ 371 (c)(1),
(2), (4) Date: May 22, 2012

(87) PCT Pub. No.: WO2011/073871
PCT Pub. Date: Jun. 23, 2011

(65) Prior Publication Data
US 2012/0305972 A1 Dec. 6, 2012

(30) Foreign Application Priority Data
Dec. 17, 2009 (EP) .................................... 09179553

(51) Int. Cl.
*C09K 11/64* (2006.01)
*C09K 11/77* (2006.01)
(Continued)

(52) U.S. Cl.
CPC ............. *C09K 11/645* (2013.01); *C04B 35/553* (2013.01); *C09K 11/7774* (2013.01);
(Continued)

(58) Field of Classification Search
USPC ....................... 252/301.4 H; 313/503; 257/98
See application file for complete search history.

(56) References Cited

U.S. PATENT DOCUMENTS 6,409,938 B1 6/2002 Comanzo
7,790,058 B2 9/2010 Shimomura et al.
(Continued)

FOREIGN PATENT DOCUMENTS

CN 100999662 A 7/2007
CN 101255338 A 9/2008
(Continued)

OTHER PUBLICATIONS

S. Geller "Refinement of the Crystal Structure of Cryolithionite" The American Mineralogist vol. 56, Jan.-Feb. 1971.

*Primary Examiner* — Carol M Koslow

(57) ABSTRACT

The invention provides a light emitting diode device comprising a light emitting diode arranged on a substrate and a wavelength converting element. The wavelength converting element contains a luminescent material a $Mn^{4+}$-activated fluoride compound having a garnet-type crystal structure. The $Mn^{4+}$-activated fluoride compound preferably answers the general formula $\{A_3\}[B_{2-x-y}Mn_xMg_y](Li_3)F_{12-d}O_d$, in which formula A stands for at least one element selected from the series consisting of $Na^+$ and $K^+$ and B stands for at least one element selected from the series consisting of $Al^{3+}$, $B^{3+}$, $Sc^{3+}$, $Fe^{3+}$, $Cr^{3+}$, $Ti^{4+}$ and $In^{3+}$, and in which formula x ranges between 0.02 and 0.2, y ranges between 0.0 (and incl. 0.0) and 0.4 and d ranges between 0 (and incl. 0) and 1. As the luminescent materials of the described type and structure have high stability and low sensitivity towards humid environments, they can advantageously be used as in wavelength conversion elements of LED devices.

14 Claims, 2 Drawing Sheets

(51) Int. Cl.
*H01L 33/50* (2010.01)
*C04B 35/553* (2006.01)

(52) U.S. Cl.
CPC ....... *H01L33/502* (2013.01); *C04B 2235/3201* (2013.01); *C04B 2235/3203* (2013.01); *C04B 2235/3206* (2013.01); *C04B 2235/3217* (2013.01); *C04B 2235/3224* (2013.01); *C04B 2235/3241* (2013.01); *C04B 2235/3262* (2013.01); *C04B 2235/3272* (2013.01); *C04B 2235/3286* (2013.01); *C04B 2235/3409* (2013.01); *C04B 2235/5292* (2013.01); *C04B 2235/5436* (2013.01); *C04B 2235/764* (2013.01)

(56) References Cited

U.S. PATENT DOCUMENTS

| | | | |
|---|---|---|---|
| 8,496,852 | B2 | 7/2013 | De Graaf et al. |
| 2007/0205712 | A1* | 9/2007 | Radkov et al. ............. 313/503 |
| 2007/0262288 | A1 | 11/2007 | Naum |
| 2012/0261704 | A1* | 10/2012 | Meyer et al. ............... 257/98 |

FOREIGN PATENT DOCUMENTS

| | | |
|---|---|---|
| JP | 2003105336 A | 4/2003 |
| JP | 2007277277 A | 10/2007 |
| JP | 2009079094 A | 4/2009 |
| WO | 2008051486 A1 | 5/2008 |
| WO | 2009012301 A2 | 1/2009 |

\* cited by examiner

LIGHT EMITTING DIODE DEVICE WITH LUMINESCENT MATERIAL

BACKGROUND OF THE INVENTION

The invention relates to a light emitting diode device comprising a light emitting diode arranged on a substrate, and a wavelength converting element containing a $Mn^{4+}$-activated fluoride compound. The invention also relates to a luminescent material as well as to a method for preparing such luminescent material.

Light emitting diode devices (abbr. as LED devices) are widely known as new semiconductor light sources with promising lighting properties for future applications. These LED devices should eventually substitute many of the current light sources, like incandescent lamps. They are especially useful in display lights, warning lights, indicator lights and decoration lights.

The color of the emitted light depends on the type of semiconductor material. LEDs produced from Group III-V alloys—such as GaN—are well-known for their ability to produce emission in the green to UV range of the electromagnetic spectrum. During the last decade, methods have been developed to convert (parts of) the radiation emitted by such 'blue' or '(near)UV' LEDs into radiation of longer wavelength. Phosphors are widely used luminescent materials for this purpose. These phosphors are crystalline, inorganic compounds of high chemical purity and precisely controlled compositions. They comprise small amounts of specifically selected elements ('activators'), which make them to efficient luminescent materials.

In addition to colored LEDs, the development of so-called 'white light LEDs' is also very important. An interesting configuration in this field is based on converting a part of the light generated by a blue/UV LED and mixing that converted part with the non-converted part of said generated light, so obtaining white or white-like light. In this area blue emitting GaInN LEDs are most popular. $Ce^{3+}$-activated Yttrium Aluminum Garnet (YAG-Ce) and $Eu^{2+}$-activated Ortho Silicates (BOSE, OSE) are well-known phosphors for this purpose.

A LED device as described in the opening paragraph is known as such, for example from the patent publication WO 2009/012301-A2. This document describes in great detail a number of LED devices in which $Mn^{4+}$-activated fluoride compounds are applied as a luminescent material in the wavelength converting elements of these devices. Emission and excitation spectra of a number of $K_2[XF_6]:Mn^{4+}$ (X=Nb or Ta) and $K_3[XF_7]:Mn^{4+}$ (X=Bi, Y, La or Gd) phosphor compounds are shown. These luminescent materials appear to show a narrow band or line emission in the red spectral region (600-660 nm) of the electromagnetic spectrum. This is very attractive as LED devices comprising such luminescent materials in their wavelength converting elements are able to produce 'warm white' light. This is light with a comparative color temperature (CTT) below 5000K.

OBJECTS AND SUMMARY OF THE INVENTION

The known LED devices have several disadvantages. A first disadvantage to be mentioned concerns the fluoride compounds used in the wavelength converting elements, most of which are (less or more) toxic. A second disadvantage pertains to the handling of these fluoride compounds, which in practice is not easy, due to their relatively high sensitivity towards humid environments. Prolonged exposure of these materials to (humid) air causes formation of a thin water film on the surface of the material, leading to (surface) decomposition. This disadvantageous property affects both the pure materials (causing short shelf times) and the LED devices in which they are applied (causing decrease of performance in time).

The current invention aims at circumventing at least the mentioned drawbacks of the known devices.

In addition, the invention has as an object to provide new LED devices with wavelength converting elements containing $Mn^{4+}$-activated fluoride compounds which are less toxic and less sensitive towards humid environments.

A further object is providing a novel class of $Mn^{4+}$-activated fluoride compounds with attractive luminescent properties for use in LED devices, which should preferably provide the devices the possibility of producing warm white light.

According to the present invention, these and other objects are achieved by providing a light emitting diode device comprising a light emitting diode arranged on a substrate and a wavelength converting element containing a $Mn^{4+}$-activated fluoride compound as a luminescent material, wherein the $Mn^{4+}$-activated fluoride compound has a garnet-type crystal structure.

The invention is based on the insight gained by the inventors that the sensitivity towards humid environments of $Mn^{4+}$-activated fluoride compound with a garnet-type crystal structure is considerably less than the sensitivity towards humid environment of the known compounds described in WO 2009/012301. The described compounds do not have a garnet-type crystal structure. The inventors moreover believe that, in view of the chemically inert character of the new invented luminescent compounds, their toxicity is low as compared with similar known compounds disclosed in said patent publication. These properties of the luminescent compounds make their application in LED devices more attractive, both in the production and in the use of the devices.

Fluorine compounds having a garnet-type crystal structure can be represented by the following general formula: $\{A_3\}[B_2](C_3)F_{12}$, in which F stands for fluoride and in which A, B and C represent ions of metal or metal-like elements. These three types of ions are positioned respectively on the dodecahedral, the octahedral and the tetrahedral sites of the garnet crystal structure. Generally speaking, elements A and C are monovalent (+) whereas element B is trivalent (3+). However, especially on the octahedral sites, substitutions with charge compensations are possible, so that also combinations of a bivalent and a tetravalent metal ion on these sites can be found.

The presence of both $Mn^{4+}$ and $F^-$ ions in the garnet structure is believed to be essential for providing the interesting narrow band or line emission in the red spectral region of the electromagnetic spectrum. This means the region between appr. 600 and appr. 660 nm.

A preferred embodiment of the LED device according to the present invention is characterized in that the $Mn^{4+}$-activated fluoride phosphor compound answers the formula $\{A_3\}[B_{2-x-y}Mn_xMg_y](Li_3)F_{12-d}O_d$, in which formula A stands for at least one element selected from the series consisting of $Na^+$ and $K^+$ and B stands for at least one element selected from the series consisting of $Al^{3+}$, $B^{3+}$, $Sc^{3+}$, $Fe^{3+}$, $Cr^{3+}$, $Ti^{4+}$ and $In^{3+}$, and in which formula x ranges between 0.02 and 0.2, y ranges between 0.0 (and incl. 0.0) and 0.4 (i.e. $0.0 \leq y < 0.4$) and d ranges between 0 (and incl. 0) and 1 (i.e. $0 \leq d < 1$).

Although the above-mentioned inventive insight in principle can be achieved with all possible $Mn^{4+}$-activated fluoride compounds having a garnet-type crystal structure, especially compounds with $Na^+$ and/or $K^+$ on the dodecahedral sites, $Al^{3+}$, $B^{3+}$, $Sc^{3+}$, $Fe^{3+}$, $Cr^{3+}$, $Ti^{4+}$ and/or $In^{3+}$ on the octahedral sites and $Li^+$ on the tetrahedral sites are preferred. Based on ion-radii considerations in combination with requirements posed by the spatial structure of garnets, these preferred compounds are believed to form highly stable crystalline compounds.

The $Mn^{4+}$ ions are believed to be located on octahedral sites of the garnet crystal structure. Ion radii calculations show that $Mg^{2+}$ is preferably present on the same crystal sites for charge compensation reasons. The amount of $Mn^{4+}$ in the preferred compounds ranges between 1 and 10 mol % based on the total $B^{3+}$-ion content. A higher amount of $Mn^{4+}$ ions appears to cause a high so-called 'self quenching'. If less than 1 mol % $Mn^{4+}$ is present on the octahedral sites of the garnet structure, no or hardly any activating effect is seen in the LED device. In such materials, the absorption on $Mn^{4+}$ appears to be negligible. $Mn^{4+}$-amounts between 5 and 8 mol % are preferred, as in these conditions an optimal match between both the self-quenching effect and the desired absorbance level is reached.

In the preferred embodiment of the LED device, $Mg^{2+}$ is also present on the octahedral sites in the garnet structure. The presence of $Mn^{4+}$ causes charge imbalance in the garnet structure, which can be compensated by the presence of $Mg^{2+}$. The amount of $Mg^{2+}$ can be chosen somewhat broader as the amount of $Mn^{4+}$. Therefore the amount of $Mg^{2+}$ in the preferred garnet compounds may range between 0 and 20 mol % based on the total $B^{3+}$-ion content, whereby the range includes the value 0 mol %. A higher amount of $Mg^{2+}$ ions appears to cause the negative effect of lattice defects, e.g. anion vacancies. $Mg^{2+}$-amounts between 1 and 10 mol % are preferred, as in these conditions an optimal match between both charge compensation and luminescence efficiency is reached.

Practice has shown that the amount of $F^-$ can somewhat deviate from the stoichiometrical amount of 12 atoms per crystal cell unit. This deviation is indicated by the factor d, which ranges between 0 (and incl. 0) and 1. It is stressed that, due to charge compensation effects, a small amount of the $F^-$ can also be replaced by oxygen. This can be the case if a small part of the trivalent ions of the octahedral sites are replaced by ions of higher valence, like $Ti^{4+}$. Under usual conditions, this will always be below appr. 8 mol % and is preferably below 4 mol %, all based on the total amount of $F^-$ in the garnet structure. An increase in the amount of $O^{2-}$ at the expense of $F^-$ in the garnet structure most generally causes an increased shift of the emission of the phosphor compound into the deeper red, which is undesired.

A more preferred embodiment of the LED device according to the present invention is characterized in that in that the composition of the $Mn^{4+}$-activated fluoride compound substantially answers the formula $\{Na_3\}[Al_{2-x-y}Mn_xMg_y](Li_3)F_{12-d}O_d$. The ranges of the indices are as described before. From experimental data, it was concluded that, within the described broader class of garnet-type compounds, this series of compounds is extremely stable. This stability makes the application of these compounds in LED devices very attractive, both in the production and in the use of the devices.

A further interesting embodiment of the LED device according to the invention has the feature that the wavelength converting element is formed as a ceramic platelet. This feature has especially value in LED devices to be used for producing white light. In principle the luminescent material can be formed with or without additional filler materials by pressing the materials to a sheet, sintering these sheets according to a certain heating procedure and separating platelets of desired dimensions from said sintered sheet, for example by (laser) carving and breaking. As in this manner ceramic platelets of precise thickness can be manufactured, wavelength converting elements formed of such platelets are very suitable in LED devices which should convert (near) UV or blue LED light into white light.

Another interesting embodiment of the LED device according to the invention has the feature that the wavelength converting element is formed as a shaped body of resin material in which an amount of the $Mn^{4+}$-activated fluoride compound is incorporated. Said shaped body can for example be formed as a lens or as a plate. However, other structures are also possible within the scope of the invention. The amount of fluoride compound with garnet-type crystal structure in the resin can be chosen dependent on the desired amount of converted light, the volume of the body, etc.

The invention also provides a new luminescent material containing a $Mn^{4+}$-activated fluoride compound. This material is characterized in that the compound has a garnet-type crystal structure. Materials of this composition are relatively less toxic, have relatively low sensitivity towards humid environments and show interesting emission spectra in the near red region of the electromagnetic spectrum (600-660 nm).

Especially interesting is the material that answers the formula $\{A_3\}[B_{2-x-y}Mn_xMg_y](Li_3)F_{12-d}O_d$, in which formula A stands for at least one element selected from the series consisting of $Na^+$ and $K^+$ and B stands for at least one element selected from the series consisting of $Al^{3+}$, $B^{3+}$, $Sc^{3+}$, $Fe^{3+}$, $Cr^{3+}$, $Ti^{4+}$ and $In^{3+}$, and in which formula x ranges between 0.02 and 0.2, y ranges between 0.0 (and incl. 0) and 0.4 and d ranges between 0 (and incl. 0) and 1. This material can be advantageously applied in phosphor-coated LED devices. This holds especially for the luminescent material the composition of which substantially answers the formula $\{Na_3\}[Al_{2-x-y}Mn_xMg_y](Li_3)F_{12-d}O_d$. For reasons described before, luminescent materials wherein the amount of $Mn^{4+}$ is between 1 and 10 mol % whereas the amount of $Mg^{2+}$ is between 1 and 20 mol % are preferred. Most preferred however are compositions with a $Mn^{4+}$-content between 5 and 8.0 mol % and an $Mg^{2+}$-content between 1 and 10 mol %.

Another interesting aspect of the invention relates to a method for preparing a luminescent material as described in the previous paragraph. This method is characterized in that it encompasses the following steps:

Preparing a first aqueous solution by dissolving $K_2MnF_6$ in water containing at least 20 vol % HF, Preparing a second aqueous solution of salts of the remaining metals of which the intended garnet is composed, in molar ratio's corresponding to the garnet composition, Mixing stoichiometric amounts of both solution while stirring the resulting mixture, and Isolating the resulting garnet composition from the mixture.

It will be clear to the skilled persons that the sequence in which the first and second aqueous solution are prepared is of no importance. It is however highly preferred that, during the mixing of these solutions, the second solution is added to the first solution during stirring the so formed mixture. Care should be taken that the amount of added second solution is chosen so that a stoichiometric amount of $Mn^{4+}$ to the amount of the other metals, which are already in stoichiometric amounts available in the first solution.

It is preferred that the first aqueous solution contains a small amount of $NaHF_2$. Adding this compound prevents that part of the $Mn^{4+}$ is reduced. After mixing the solutions and stirring the mixture for some 5 minutes, the resulting turbid solution is filtered off and washed several times with 2-propanol. The obtained powder is subsequently dried under vacuum at 110° C. In order to obtain the right grain size, the powder may be mechanically ground in a mortar. The so-obtained powder is analyzed by X-ray and further used in wavelength converting elements of LED devices according to the present invention.

It is stressed that not only the invented $Mn^{4+}$-activated fluoride compounds with garnet-type crystal structure in their pure form enhance the desired performance of the light in a LED device, but that also composite materials and mixed crystals of the invented compounds were found to do so. Composites are defined as consisting of two or more on finite scale distinguishable materials, e.g. core shell materials, composite ceramics or coated particles. A mixed crystal in contrast has a homogenous distribution of the constituting elements on atomic scale.

This invention therefore also pertains to composites of $\{A_3\}[B_{2-x-y}Mn_xMg_y](Li_3)F_{12-d}O_d$ type garnets with oxide garnets $A_3B_2(CO_4)_3$ including but not limited to YAG ($Y_3Al_5O_{12}$), $Mg_3Al_2Si_3O_{12}$ or $Ca_3Al_2Si_3O_{12}$. These composites are preferably oxide garnet coatings on $\{Na_3\}[Al_{2-x-y}Mn_xMg_y](Li_3)F_{12-d}O_d$ type phosphor particles, or core shell materials, where the $\{Na_3\}[Al_{2-x-y}Mn_xMg_y](Li_3)F_{12-d}O_d$ type is surrounded by an oxide garnet shell. The difference between a coating and a shell is mainly the relative amount of the respective materials, whereas a coating is less than 10% w/w of the total material, in a core shell material the shell may be 50% w/w or even more. The advantage of such coated or core shell materials are the increased stability with respect to humidity and the option to vary the refractive index of the phosphor. With increased stability it is also expected that toxicity will be further reduced.

The same advantages are expected for mixed crystals of $\{Na_3\}[Al_{2-x-y}Mn_xMg_y](Li_3)F_{12-d}O_d$ with oxide garnets, with the general formula of the mixed crystals: $(1-a) \{Na_3\}[Al_{2-x-y}Mn_xMg_y](Li_3)F_{12-d}O_d * a A_3B_2(CO_4)_3$. The formation of such mixed crystals was found to enable the variation of excitation and emission wavelengths maxima and influence thermal quenching properties.

BRIEF DESCRIPTION OF THE DRAWING

The invention will be explained and illustrated in terms of a number of embodiments, with the help of the drawing, in which.

DESCRIPTION OF THE PREFERRED EMBODIMENTS

Figure 1:
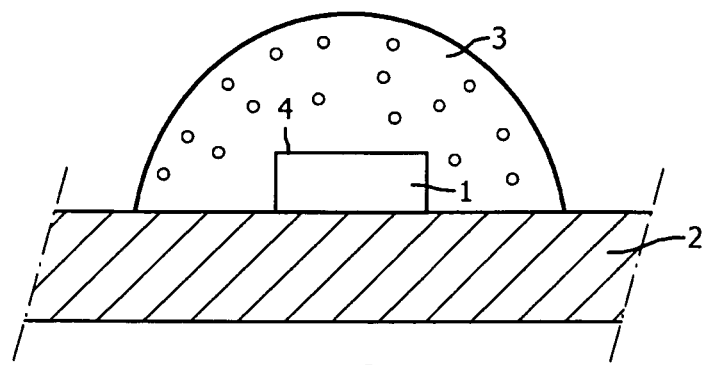
FIG. 1 shows a first embodiment of the LED device according to the invention.

A first embodiment of the present invention is schematically illustrated by FIG. 1. This Figure shows a cross-section of a LED device comprising a semiconductor light emitting diode (1), which is connected to a substrate (2), sometimes referred to as sub-mount. The diode (1) and substrate (2) are connected by means of appropriate connecting means, like solder or (metal-filled) adhesive.

The diode (1) is of the GaInN type, emitting during operation light having a wavelength of 450 nm. In the present embodiment, said light exits LED (1) via emitting surface (4). A wavelength converting element (3) formed as a convex lens shaped body is positioned adjacent to LED (1). This lens is largely made of a high temperature resistant silicone resin, in which grains are incorporated of a $Mn^{4+}$-activated fluoride compound having a garnet-type crystal structure. Latter compound acts as a luminescent material in the lens. In the present embodiment said silicone resin contains 16 vol % $\{Na_3\}[Al_{1.94}Mn_{0.03}Mg_{0.03}](Li_3)F_{12}$, having a grain size of appr. 10 micron. The type of silicone is chosen so that its refractive index is almost identical with the refractive index of the phosphor compound, namely 1.34. By using (almost) identical refractive indices, scattering losses of the LED light through the wavelength converting element (3) are as low as possible.

In an alternative embodiment, the invented luminescent material is compounded with highly transparent fluoroplastics (e.g. 3M Dyneon™ THV2030G or THV220) with matched refractive index. The resulting composite may be transferred into a suitable shape by known techniques. These shapes may be used as functional optical parts of the LED or simply as components for color conversion only.

Figure 3:
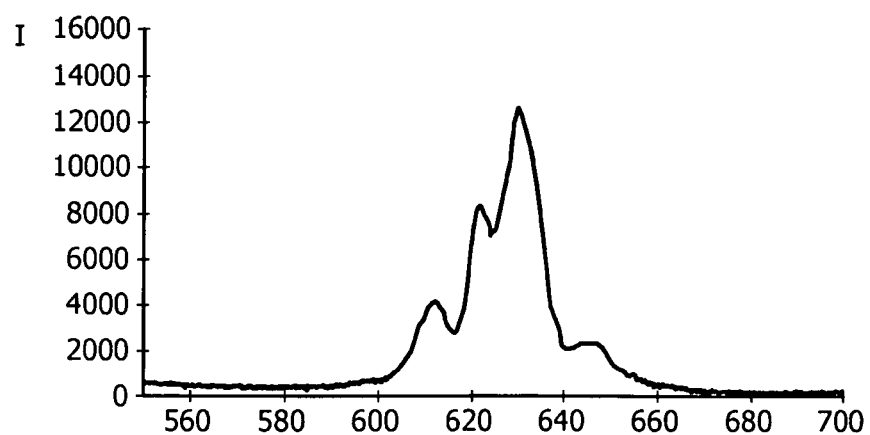
FIG. 3 shows a graph of the emission spectrum of the first embodiment according to the invention.

The amount of luminescent compound and the dimensions of the wavelength converting element (3) are chosen so that all the blue light generated by the LED (1) is converted into red light having a wavelength of appr. 630 nm. A typical emission spectrum of the light exiting the here described LED device is shown in FIG. 3. In this Figure, the intensity of the emission I (arbitrary units) is measured as a function of the wavelength $\lambda$ (nm). It is stressed that, for adapting the color of the exiting red LED light, additional phosphors of other (known) types can be used. Thus, the invention is not limited to LED devices comprising only a single phosphor of garnet-type crystal structure in the wavelength converting element (3), but mixtures of this phosphor with other (known) phosphors can be applied as well.

Figure 2:
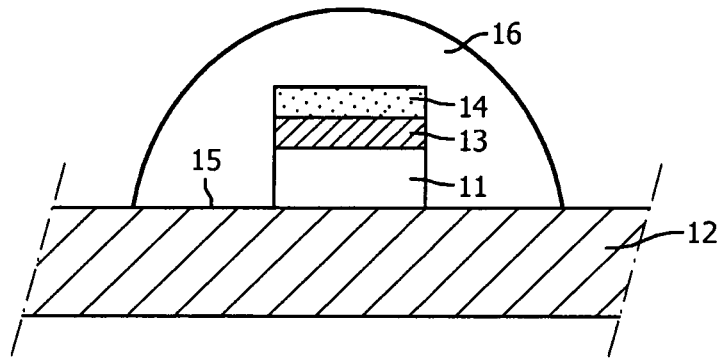
FIG. 2 shows a second embodiment of the LED device according to the invention.

FIG. 2 depicts a schematic cross-section of a second embodiment of the present invention designed as a white light generating LED device. This Figure shows a conventional blue or (near)UV generating light emitting diode (11), which is attached to a substrate (12) using solder bumps (not shown). Substrate (12) has metal contact pads on its surface to which LED (11) is electrically connected (not shown). By means of these solder pads, LED (11) can be connected to a power supply. In the present example, LED (11) is of the AlInGaN type and emits blue light having a peak wavelength of appr. 420-470 nm. It goes without saying that other semiconductor materials having other peak wavelengths can be used as well within the scope of the present invention.

Two wavelength converting elements formed as ceramic platelets (13) and (14) are positioned adjacent to LED (11). The platelets (13, 14) and LED (11) can mutually be affixed by means of an adhesive (like a high temperature resistant silicone material or a low melting glass) or by means of mechanical clamping. In the present embodiment, an adhesive is used. To keep unwanted absorptions as low as possible, the adhesive layers between LED (11) and element (13) as well as between element (13) and element (14) have been made as thin as possible.

In the present embodiment, element (13) is shaped as a red phosphor plate whereas element (14) is shaped as a yellow phosphor plate. The surface dimensions of both plates are almost the same as the surface dimension of the light emitting surface (15) of LED (11), although they may be somewhat larger without having significant effect on the (white) exiting light. In case LED (11) is small enough, side emission of the blue radiation from the LED (11) can be ignored. The thicknesses of both elements are typically in the range of 50-300 micron. The actual thickness of the platelets of course depends on the spectral power distribution of the LED light and the type of phosphor compound present in the platelets.

In the described embodiment, the red phosphor platelet of element (13) was prepared of a pure $Mn^{4+}$-activated fluoride phosphor compound with a garnet-type crystal structure. For this purpose the phosphor compound substantially answered the formula $\{Na_3\}[Al_{1.94}Mn_{0.03}Mg_{0.03}](Li_3)F_{12}$ having a garnet-type crystal structure. For the yellow phosphor platelet of element (14), the compound $Y_3Al_5O_{12}$:Ce ('Ce-doped YAG') was used.

On the LED (11) and both wavelength conversion elements (13, 14) an optical element (16) in the form of lens structure is placed, allowing optimization of the emission pattern of the LED device. By means of a proper choice of this optical element, a Lambertian pattern can be obtained, but also a pattern that allows a good coupling with an optical waveguide structure. It is also possible to design the optical element (16) in such a way that a uniform illumination distribution of the generated white light is obtained. This makes the present LED device very suitable for backlighting in LCD type applications.

Figure 4:
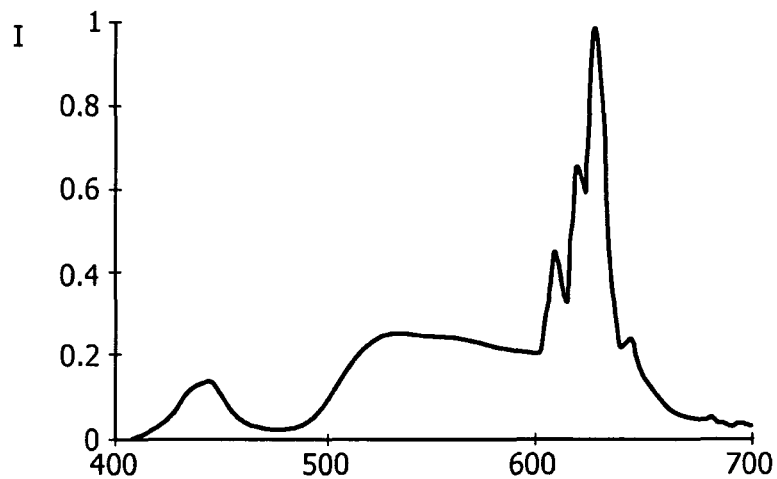
FIG. 4 shows a graph of the emission spectrum of the second embodiment according to the invention.

FIG. 4 shows a typical emission spectrum of the described white light generating LED device according to FIG. 2. In this Figure, the intensity of the emission I (arbitrary units) is measured as a function of the wavelength λ (nm). The spectrum shows emission in the red spectral region from appr. 600-appr. 660 nm, with an emission maximum around 630 nm.

The luminescent material used in the wavelength converting element (3, 13) of the LED devices as described above substantially answers the formula $\{Na_3\}[Al_{1.94}Mn_{0.03}Mg_{0.03}](Li_3)F_{12}$ and has a garnet-type crystal structure. Said material was obtained as co-precipitates at room temperature from aqueous HF solution containing $Mn^{4+}$ as a dopant. For the preparation of said $(Na_3)$ $[Al_{1.94}Mn_{0.03}Mg_{0.03}](Li_3)F_{12}$, stoichiometric amounts of the starting materials NaCl, LiCl, $MgCl_2*6H_2O$ and $AlCl_3*6H_2O$ as well as a small amount of $NaHF_2$ were dissolved in water and subsequently added to a 48% HF aqueous solution containing $K_2MnF_6$. The concentration of $Mn^{4+}$ in the HF solution was 1 mol. %. The precipitates were filtered, washed repeatedly with 2-propanol, and then dried at 110° C. in vacuum. The obtained product was ground in a mortar.

Figure 5:
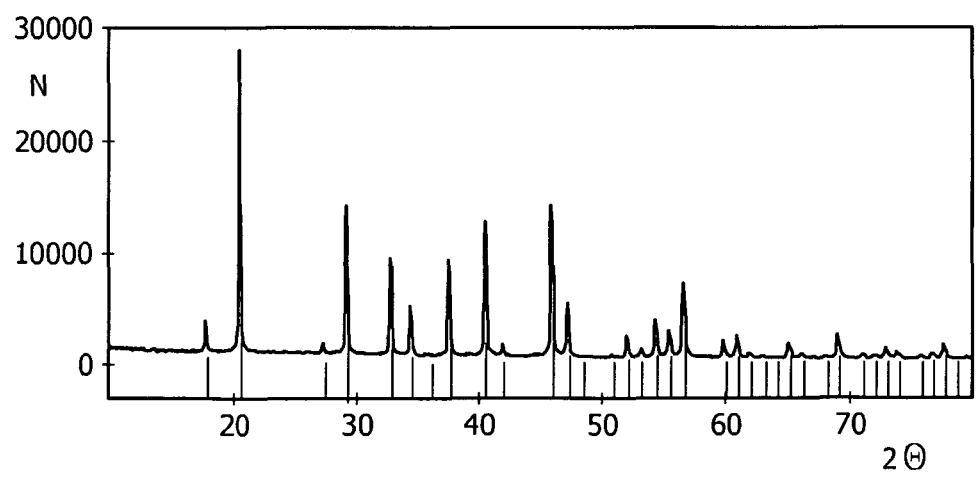
FIG. 5 shows a graph of the x-ray pattern of a sample of the invented compound $\{Na_3\}[Al_{1.94}Mn_{0.03}Mg_{0.03}](Li_3)F_{12}$ having a garnet-type crystal structure.

FIG. 5 shows an X-ray powder pattern spectrum measured on a representative sample of one of the precipitates, using Cu-Kα radiation. In this Figure, the number of counts (N) is shown as a function of the diffracted angle 2Theta. With this measurement, these samples could be identified to be $\{Na_3\}$ $[Al_{1.94}Mn_{0.03}Mg_{0.03}](Li_3)F_{12}$ having a garnet-type crystal structure. No extra phases were detected in this sample.

It is stressed that it is possible to use a variety of other starting materials to produce the inventive garnet-type fluoride phosphors via co-precipitation from aqueous solution. Especially hydroxides, nitrates, alkoxides, and carbonates are other good starting materials for use in the co-precipitation method. Also other metal ion salts can be used as starting material, like with salts of $K^+$, $B^{3+}$, $Sc^{3+}$, $Fe^{3+}$, $Cr^{3+}$, $Ti^{4+}$ and/or $In^{3+}$. When using these starting materials, $Mn^{4+}$-activated fluoride phosphor compound with garnet-type crystal structure of other compositions can be prepared as well.

An amount of the $\{Na_3\}[Al_{1.94}Mn_{0.03}Mg_{0.03}](Li_3)F_{12}$ powder prepared as described above underwent further intense mechanically grinding until the mean particle size was appr. 5 micron. Subsequently the powder was pressed to a plate and sintered at 200° C. in a furnace under an axial pressure of 2 kbar. After cooling to room temperature, the so-obtained ceramic plate was scored with a laser and broken into individual platelets. These platelets were used as wavelength conversion elements in LED devices according to the present invention.

While the invention has been illustrated and described in detail in the drawings and foregoing description, such illustration and description are to be considered illustrative or exemplary and not restrictive; the invention is not limited to the disclosed embodiments. For example, it is possible to operate the invention in an embodiment wherein other (optical) element(s) are present between the LED and the wavelength converting elements or wherein more than one LED is operated in combination with one converting element.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage. Any reference signs in the claims should not be construed as limiting the scope.

The invention claimed is:

1. A light emitting diode device comprising:
a light emitting diode arranged on a substrate, and
a wavelength converting element comprising a $Mn^{4+}$-activated fluoride compound as a luminescent material, wherein the $Mn^{4+}$-activated fluoride compound has a garnet-type crystal structure.

2. A light emitting diode device according to claim 1, wherein the $Mn^{4+}$-activated fluoride compound has the formula $\{A_3\}[B_{2-x-y}Mn_xMg_y](Li_3)F_{12-d}O_d$, wherein A is least one element selected from the group consisting of $Na^+$ and $K^+$ and B is at least one element selected from the group consisting of $Al^{3+}$, $B^{3+}$, $Sc^{3+}$, $Fe^{3+}$, $Cr^{3+}$, $Ti^{4+}$ and $In^{3+}$, and wherein $0.02 < x < 0.2$, $0.0 \leq y < 0.4$, and $0 \leq d < 1$.

3. A light emitting diode device according to claim 2, wherein the $Mn^{4+}$-activated fluoride compound material has the formula

$\{Na_3\}[Al_{2-x-y}Mn_xMg_y](Li_3)F_{12-d}O_d$.

4. A light emitting diode device according to claim 1, wherein the wavelength converting element is formed as a ceramic platelet.

5. A light emitting diode device according to claim 1 wherein the wavelength converting element is formed as a shaped body of resin material comprising the $Mn^{4+}$-activated fluoride compound.

6. A luminescent material comprising a $Mn^{4+}$-activated fluoride compound, wherein the compound has a garnet-type crystal structure.

7. A luminescent material according to claim 6, wherein the $Mn^{4+}$-activated fluoride compound has the formula $\{A_3\}$ $[B_{2-x-y}Mn_xMg_y](Li_3)F_{12-d}O_d$, wherein A is at least one element selected from the group consisting of $Na^+$ and $K^+$ and B is least one element selected from the group consisting of $Al^{3+}$, $B^{3+}$, $Sc^{3+}$, $Fe^{3+}$, $Cr^{3+}$, $Ti^{4+}$ and $In_3^+$, and wherein $0.02 < x < 0.2$, $0.0 \leq y < 0.4$, and $0 \leq d < 1$.

8. A luminescent material according to claim 7, wherein the $Mn^{4+}$-activated fluoride compound has the formula $\{Na_3\}$ $[Al_{2-x-y}Mn_xMg_y](Li_3)F_{12-d}O_d$.

9. A method for preparing a luminescent material comprising a $Mn^{4+}$-activated fluoride compound, wherein the compound has a garnet-type crystal structure characterized in that it encompasses the following steps:
- preparing a first aqueous solution by dissolving $K_2MnF_6$ in water containing at least 20 vol % HF,
- preparing a second aqueous solution of salts of the remaining metals of which the intended garnet is composed, in molar ratio's corresponding to the garnet composition,
- mixing stoichiometric amounts of both solutions to form a mixture comprising a garnet composition,
- stirring the mixture, and
- isolating the garnet composition from the mixture.

10. The method of claim 9 wherein the first aqueous solution contains $NaHF_2$.

11. The method of claim 9 wherein isolating the resulting garnet composition from the mixture comprises filtering the garnet composition from the mixture.

12. The method of claim 11 further comprising the step of washing the garnet composition with 2-propanol to create a powder.

13. The method of claim 12 further comprising the step drying the powder at under vacuum at 110° C.

14. The method of claim 13 further comprising the step of mechanically grinding the powder.

\* \* \* \* \*